(12) United States Patent
Bruce et al.

(10) Patent No.: US 9,646,828 B2
(45) Date of Patent: *May 9, 2017

(54) REACTED PARTICLE DEPOSITION (RPD) METHOD FOR FORMING A COMPOUND SEMI-CONDUCTOR THIN-FILM

(75) Inventors: Allan James Bruce, Scotch Plains, NJ (US); Sergey Frolov, Murray Hill, NJ (US); Michael Cyrus, Summit, NJ (US)

(73) Assignee: SUNLIGHT PHOTONICS INC., Edison, NJ (US)

( * ) Notice: Subject to any disclaimer, the term of this patent is extended or adjusted under 35 U.S.C. 154(b) by 256 days.

This patent is subject to a terminal disclaimer.

(21) Appl. No.: 12/185,369

(22) Filed: Aug. 4, 2008

(65) Prior Publication Data
US 2010/0288358 A1    Nov. 18, 2010

Related U.S. Application Data

(63) Continuation-in-part of application No. 12/061,450, filed on Apr. 2, 2008.

(51) Int. Cl.
*H01L 31/0296* (2006.01)
*H01L 21/02* (2006.01)
(Continued)

(52) U.S. Cl.
CPC .. *H01L 21/02551* (2013.01); *H01L 21/02568* (2013.01); *H01L 21/02601* (2013.01);
(Continued)

(58) Field of Classification Search
CPC ......... H01L 21/02551; H01L 21/02568; H01L 21/02601; H01L 21/02617;
(Continued)

(56) References Cited

U.S. PATENT DOCUMENTS 3,978,510 A    8/1976    Kasper et al.
4,181,256 A    1/1980    Kasagi
(Continued)

FOREIGN PATENT DOCUMENTS

JP    9326499 A    12/1997
JP    2007096031 A    4/2007
(Continued)

OTHER PUBLICATIONS

Roecker, R., Spray Technology , Brochure D03, Southwest Research Institute, 1998,4 pages.
(Continued)

*Primary Examiner* — Golam Mowla
(74) *Attorney, Agent, or Firm* — Stuart H. Mayer; Mayer & Williams PC (57) ABSTRACT

A method is provided for fabricating a thin-film semiconductor device. The method includes providing a plurality of raw semiconductor materials. The raw semiconductor materials undergo a pre-reacting process to form a homogeneous compound semiconductor material. This pre-reaction typically includes processing above the liquidus temperature of the compound semiconductor. The compound semiconductor material is reduced to a particulate form and deposited onto a substrate to form a thin-film having a composition and atomic structure substantially the same as a composition and atomic structure of the compound semiconductor material.

17 Claims, 2 Drawing Sheets

(51) Int. Cl.
  *H01L 31/032* (2006.01)
  *H01L 31/0392* (2006.01)
  *H01L 31/18* (2006.01)

(52) U.S. Cl.
  CPC .. *H01L 21/02617* (2013.01); *H01L 21/02628* (2013.01); *H01L 31/0322* (2013.01); *H01L 31/0392* (2013.01); *H01L 31/03923* (2013.01); *H01L 31/03925* (2013.01); *H01L 31/1828* (2013.01); *H01L 31/1832* (2013.01); *H01L 31/1836* (2013.01); *Y02E 10/541* (2013.01); *Y02E 10/543* (2013.01); *Y02P 70/521* (2015.11)

(58) Field of Classification Search
  CPC ........... H01L 21/02628; H01L 31/0392; H01L 31/1828; H01L 31/1832; H01L 31/1836; H01L 31/0322
  See application file for complete search history.

(56) References Cited

U.S. PATENT DOCUMENTS

| | | | |
|---|---|---|---|
| 4,652,332 | A | 3/1987 | Ciszek |
| 4,740,386 | A | 4/1988 | Cheung |
| 5,441,897 | A | 8/1995 | Noufi et al. |
| 5,626,688 | A | 5/1997 | Probst et al. |
| 6,127,202 | A | 10/2000 | Kapur et al. |
| 6,258,620 | B1 | 7/2001 | Morel et al. |
| 7,026,258 | B2 | 4/2006 | Taunier et al. |
| 7,306,823 | B2 | 12/2007 | Sager et al. |
| 2003/0178104 | A1 | 9/2003 | Sekine |
| 2003/0219544 | A1 | 11/2003 | Smith |
| 2005/0183768 | A1 | 8/2005 | Roscheisen et al. |
| 2006/0008928 | A1 | 1/2006 | Beppu et al. |
| 2006/0210640 | A1 | 9/2006 | Kerkhof |
| 2007/0163637 | A1 | 7/2007 | Robinson et al. |
| 2008/0038555 | A1 | 2/2008 | Sekine et al. |
| 2008/0041532 | A1 | 2/2008 | Chou et al. |
| 2008/0175982 | A1 | 7/2008 | Robinson et al. |
| 2008/0226270 | A1 | 9/2008 | Wendt et al. |

FOREIGN PATENT DOCUMENTS

| | | |
|---|---|---|
| JP | 2005000284058 | 4/2007 |
| KR | 100246712 B1 | 3/2000 |
| WO | 99/37832 | 7/1999 |
| WO | 2007/047888 | 4/2007 |
| WO | 2009/064056 | 5/2009 |

OTHER PUBLICATIONS

Eberspacher, C. et al., "Thin-film CIS alloy PV materials fabricated using non-vacuum, particles-based techniques," Thin Solid Films 387 (2001), pp. 18-22.

P.K. Johnson et al, "A Comparative Study of Defect States in Evaporated and Selenized CIGS(S) Solar Cells", Publication date unknown, but prior to the filing date of the instant application, pp. 1-17.

Gregory M. Hanket et al., "Growth of Cu(InGa)(SeS)2 by the Reaction of Cu—Ga—In Precursors in H2Se and H2S", University of Delaware, Institute of Energy Conservation, Publication date unknown, but prior to the filing date of the instant application, 2pgs.

T. Pisarkiewicz et al., "Fabrication of thin film polycrystalline CIS photovoltaic hetrostructure", Opto-Electron. Rev., vol. 11, No. 4, (2003), pp. 297-304.

Rommel Noufi and Ken Zweibel, "High-Efficiency CDTE and CIGS Thin-Film Solar Cells: Highlights and Challenges", National Renewable Energy Laboratory, Golden, CO., Publication date unknown, but prior to the filing date of the instant application, 4pgs.

B. von Roedern et al, "Polycrystalline Thin-Film Photovoltaics: From the Laboratory to Solar Fields", May 2006, National Renewable Energy Laboratory, Golden, Co., pp. 1-4.

M. Raja Reddy, "Thin film solar cells for low cost space applications", European Space Agency, Dec. 1998, pp. 2-41.

Peter T. Erslev et al., "Study of the Electronic Properties of Matched Na-containing and Na-free CIGS Samples Using Junction Capacitance Methods", Publication date unknown, but prior to the filing date of the instant application, 6pgs.

D. Bremaud et al., "Towards the Development of Flexible CIGS Solar Cells on Polymer Films with Efficiency Exceeding 15%", Publication date unknown, but prior to the filing date of the instant application, 4pgs.

REACTED PARTICLE DEPOSITION (RPD) METHOD FOR FORMING A COMPOUND SEMI-CONDUCTOR THIN-FILM

CROSS-REFERENCE TO RELATED APPLICATION

This application is a continuation-in-part of commonly assigned, co-pending U.S. patent application Ser. No. 12/061,450, filed Apr. 2, 2008, and entitled "A Method for Forming a Compound Semi-Conductor Thin-film", which is incorporated by reference herein in its entirety.

FIELD OF INVENTION

The present invention relates to a method for forming a compound semiconductor thin-film such as a semiconductor thin-film suitable for use in photovoltaic (PV) solar cells and other devices.

BACKGROUND OF THE INVENTION

PV devices represent one of the major sources of environmentally clean and renewable energy. They are frequently used to convert optical energy into electrical energy. Typically, a PV device is made of one semiconducting material with p-doped and n-doped regions. The conversion efficiency of solar power into electricity of this device is limited to a maximum of about 37%, since photon energy in excess of the semiconductor's bandgap is wasted as heat. A fill commercialization of PV devices depends on technological advances that lead to higher efficiencies, lower cost, and stability of such devices. The cost of generating electricity may be significantly reduced by using solar modules constructed from inexpensive thin-film semiconductors such as copper indium di-selenide ($CuInSe_2$ or CIS) or cadmium telluride (CdTe). Both materials have great promise, but certain difficulties have to be overcome before commercialization.

Figure 1:
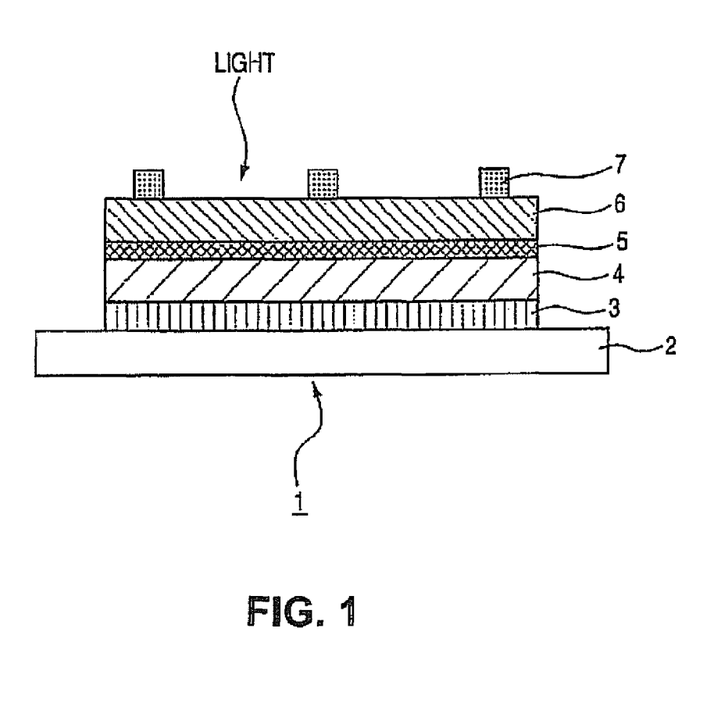
FIG. 1 is a simplified schematic diagram of a CIS or CdTe compound semiconductor thin-film solar cell.

As shown in FIG. 1, the basic form of a CIS compound semiconductor thin-film solar cell (1) comprises of a multilayer structure superposed on a substrate (2) in the following order, a back electrode (3), a light absorbing layer (4), an interfacial buffer layer (5), a window layer (6) and an upper electrode (7). The substrate is commonly soda-lime glass, metal ribbon or polyimide sheet. The back electrode is commonly Mo metal The light absorbing layer consists of a thin-film of a CIS p-type Cu-III-$V1_2$ Group chalcopyrite compound semiconductor. e.g. copper indium di-selenide (CIS). Partial substitutions of Ga for In (CIGS) and/or S for Se (CIGSS) are common practices used to adjust the bandgap of the absorber material for improved matching to the illumination.

CIS and similar light absorbing layers are commonly formed using various processing methods. These include; Physical Vapor Deposition (PVD) in which constituent elements are simultaneously, or sequentially, deposited onto a substrate. PVD methods include thermal evaporation. PVD processes typically employ expensive, high-vacuum equipment and the substrate sizes are constrained by the PVD technology and equipment.

A shortcoming of the conventional multi-source vacuum deposition methods is the difficulty in achieving compositional and structural homogeneity, both in profile and over large areas for device manufacturing. More specifically, device performance may be adversely impacted as a result of inhomogeneities, including semi-conducting properties, conversion efficiencies, reliability and manufacturing yields. Attempts to remove inhomogeneity through post-deposition processing are imperfect and can generate other detrimental effects.

Non-vacuum (NV) CIS film deposition has also been reported. NV methods include the formation of films from inks which contain dispersed nano-particles of constituent metals, or alloys, on substrates followed by post-deposition selenization (e.g. in $H_2 Se$), and thermal treatments to effect the chemical reaction and/or consolidation of the films. Such post-processing is typically carried out at sub-liquidus temperatures of the material. An example of this approach is presented in U.S. Pat. No. 7,306,823 B2 by Sager et al.

Another reported NV approach employs the electrophoretic deposition of oxide particles from solution followed by additional post-deposition processing including chemical reduction, selenization and thermal processing. An example of this approach is presented in U.S. Pat. No. 6,127,202 by Kapur et al. NV techniques are considered for deposition on large area substrates, including flexible substrates. The possibility of using simple equipment and processes is seen as a viable route to low-cost manufacturing. The challenge for NV methods is to produce semiconductor films of sufficient quality to deliver good PV performance.

The aforementioned PVD and NV techniques for manufacturing CIS-based semiconductor thin-films for PV devices have not yet produced cost effective devices with conversion efficiencies that are sufficient for most practical applications.

In PV and other multi-layer devices, reactions and diffusion at film interfaces during deposition or during post-deposition processing may impact performance. For instance it has been shown that Na thermally diffuses from soda-lime substrates into CIS layers. In this instance the effect is found considered beneficial to the performance of the PV cell. Such effects are a natural consequence of the standard processing and are not independently controlled.

The highest performing CIGS solar cells to date have been reported by workers at the National Renewable Energy Laboratory (NREL), who claim 19.9% conversion efficiency under AM 1.5 illumination. This result is for small area devices produced by elemental co-evaporation onto soda-lime substrates. Larger area devices, manufactured by both vacuum and NV methods by various entities, on glass, metal ribbon or polymer substrates, more typically demonstrate area conversion efficiencies in the range of 8-12%. It is generally accepted that this lower performance is due to shortcomings in the device processing, including the light absorbing layer. For instance, there may be compositional non-uniformity, incomplete chemical and/or structural development and other defects across the area and profile and at the interfaces of the light absorbing layer.

SUMMARY OF THE INVENTION

In accordance with the present invention, a method is provided for fabricating a thin-film semiconductor device. The method includes providing a plurality of raw semiconductor materials. The raw semiconductor materials undergo a pre-reacting process to form a homogeneous compound semiconductor material. This pre-reaction typically includes processing above the liquidus temperature of the compound semiconductor. The compound semiconductor material is reduced to a particulate form and deposited onto a substrate to form a thin-film having a composition and atomic structure substantially the same as a composition and atomic structure of the compound semiconductor material.

The reduction of the compound semiconductor material to particulate form can be achieved by various established techniques for reducing larger material bodies. These techniques include various mechanical grinding or milling approaches, including ball milling and jet milling. Ball milling is usually accomplished with the aid of "balls" of a hard material such as alumina in a container which is placed on a rolling mill. Jet milling is achieved by opposing and recirculating flows of the material to be milled. This "self-milling" process minimizes contamination. Standard jet milling is used to reduce materials to micron dimensions and potentially smaller with the aid of ultrasonic co-processing. Particles are collected during the jet milling process based on their size dependent trajectories in the counter milling flows.

It may also be advantageous to select a range or distribution of particle sizes for thin-film formation. This may be achieved by mechanical sieving or the centrifugation of particles after dispersion in a suitable carrier medium.

Once formed it can be advantageous for avoiding re-agglomeration to disperse the small semiconductor particles in a fluid. Examples include aqueous and non-aqueous liquids. The additions of surfactants may also be beneficial to stabilize the dispersions. Such practices are commonly used in the formation of "inks". The viscosity of the dispersions can also be engineered with appropriate additives to facilitate the coating process on the substrate. The dispersion medium and other additives should ideally be easily removed during post deposition processing, for example by thermal processing, to produce a thin film comprised of the semiconductor particles which can be sintered and densified in the same or subsequent post processing, including thermal post processing. Sintering and densification is a well documented approach in materials processing, while the temperature, duration and other conditions for the process can be optimized for a given material composition and particulate size.

This deposition process, from material, through particulate through film processing is herein referred to as a Reacted Particle Deposition (RPD) and it is distinct from deposition processes involving metallic, alloy, oxide or other sub-compound particulates which require a subsequent post deposition chemical reaction to form the desired compound semiconductor material.

In accordance with one aspect of the invention, the raw semiconductor materials may include II-VI compound semiconductor materials.

In accordance with another aspect of the invention, the II-VI compound semiconductor materials may be selected from the group consisting of Cd—S, Cd—Sc, Cd—Te, Cd—Zn—Te, Cd—Hg—Te, and Cu—In—Se.

In accordance with another aspect of the invention, Cu may be provided as a minor constituent along with the II-VI compound semiconductor materials.

In accordance with another aspect of the invention, the raw semiconductor materials may include I-III-VI compound semiconductor materials.

In accordance with another aspect of the invention, the I-III-VI compound semiconductor materials may be selected from the group consisting of Cu—In—Se, Cu—In—Ga—Se, Cu—In—Ga—Se—S.

In accordance with another aspect of the invention, Al may be provided in complete or partial substitution for Ga.

In accordance with another aspect of the invention, Na may be provided as a minor constituent along with the I-III-VI compound semiconductor materials.

In accordance with another aspect of the invention, an alkali element other than Na may be provided as a minor constituent long with the I-III-VI compound semiconductor materials.

In accordance with another aspect of the invention F may be provided as a minor constituent along with the I-III-VI compound semiconductor materials.

In accordance with another aspect of the invention, a halogen element other than F may be provided as a minor constituent along with the I-III-VI compound semiconductor materials.

In accordance with another aspect of the invention, compound semiconductor particles may be produced by reducing a substantially solid body of the compound semiconductor material.

In accordance with another aspect of the invention, the compound semiconductor particles may be sorted into particles of specific size or mixtures thereof prior to deposition.

In accordance with another aspect of the invention, the compound semiconductor film may be deposited directly from particulate semiconductor materials.

In accordance with another aspect of the invention, the compound semiconductor film may be deposited from dispersed particulate semiconductor materials in a carrier fluid.

In accordance with another aspect of the invention, the compound semiconductor film may be deposited by printing using dispersed particulate semiconductor inks.

In accordance with another aspect of the invention, the compound semiconductor film may be deposited by electrophoretic deposition of dispersed particulate semiconductor materials in a carrier fluid.

In accordance with another aspect of the invention, pre-reacting the raw semiconductor materials may include isolating the raw semiconductor materials at an elevated temperature to establish a structure and bonding profile representative of the deposited thin-film.

In accordance with another aspect of the invention, a PV device, is provided which includes a substrate, a first electrode disposed on the substrate, and at least one light absorbing layer that includes an RPD compound semiconductor thin-film. A second electrode is disposed over the light absorbing layer.

DETAILED DESCRIPTION

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

The processes of the present invention can be used to fabricate high-quality thin-film copper indium di-selenide (CIS)-based semiconductor devices that have PV effects and are especially adaptable for solar cell applications. For purposes of simplicity, the description of the processes of this invention will focus primarily on CIS-based structures. However, it should be understood that the processes and techniques described herein are also applicable to the fabrication of a wide variety of other compound semiconductor thin-film structures.

The processes of the present invention involve a Reacted Particle Deposition (RPD) method, which provides an alternative path for forming compound semiconductor thin-films. The RPD method can produce a uniform film with a designated composition while requiring reduced levels of post-deposition processing in comparison to other established fabrication methods. These attributes can impart multiple advantages for the design, performance and manufacture of such films for photovoltaic solar cells and other devices.

Thin-films fabricated in accordance with the RPD method will have improved compositional, chemical and structural uniformity in both profile and across their area. As a consequence, properties which are dependent on uniformity can be improved. Thermal and/or chemical post-deposition processes that are conventionally used to approach such uniformity can also be reduced or eliminated. The latter will be beneficial for minimizing interactions between device layers, process simplification and manufacturing cost reduction.

The RPD process is comprised of several parts. Specifically, (i) the production of a "pre-reacted" material of designed composition, which is compositionally uniform and has a molecular structure which is representative of the fully formed compound semiconductor, (ii) the rendition of this pre-reacted material into particles, typically <100 nanometer sized particles (iii) the optional dispersion of such particles in a carrier medium, (iv) coating or deposition of these particles onto a substrate and (v) the formation of a dense film of appropriate composition and structure via post-processing.

For the RPD method the pre-reacted material may be made by any available method of synthesis. The key attribute of the material is its pre-reacted nature, which provides a defined composition and molecular structure. The aim of the pre-reaction process is to achieve homogenization and structural definition of the material in order to simplify film deposition and post-processing.

In some examples, the RPD process can be used to fabricate thin-film compound semi-conductors having layer thicknesses less than about 10 micrometers thick, and more specifically having layer thicknesses of a few micrometers. In regard to CIS and similar materials of the type used in solar cells, the thin-films are typically polycrystalline or microcrystalline in morphology. This is distinct from the structure of epitaxially grown single crystal films, which are also sometimes used in certain solar cell devices. This is also distinct from the structure of some amorphous films, such as amorphous Si, which are sometimes used in solar cell devices. The RPD method employs deposition processes, as noted in the given examples, which can produce amorphous or polycrystalline films, their form can also be influenced by the temperature of substrate during deposition or by thermal annealing post-deposition.

For compound semiconductors, the preparation of bulk materials requires a special approach. Specifically, the raw materials ("the batch"), which include volatile elements such as the Chalcogens. S, Se or Te, should be contained in their entirety in a crucible made from a material which will not react significantly with the target materials or the processing atmosphere. For example, carbon crucibles or carbon-coated silica glass vessels may be used. Silica vessels may be evacuated and sealed around the batch of raw materials, alternatively crucibles may be placed in a sealed chamber under an appropriate pressure of inert gas such as Argon. Sealed vessels may be processed in conventional ovens or furnaces. In pressurized chambers heating is typically provided locally to the crucible with the batch while the chamber walls are unheated or cooled.

The batch should be processed at a sufficient temperature, usually above the liquidus temperature of the compound semiconductor, for a sufficient time to allow the constituents to mix and chemically react so that they may form a homogeneous compound semiconductor body. Enabling such mixing, and chemical reaction, to occur in the batch minimizes the post-processing required for the RPD thin-films. Typical processing is conducted at temperatures as high as 1000° C. under and pressures of many atmospheres. During processing in evacuated vessels, equilibrium vapors are formed above the batch. During processing in pressurized chambers, vaporization is inhibited by the overpressure of the inert gas. Component loss in the former case can be compensated by adjusting the batch formulation. The compound semiconductor target produced from the batch in the aforementioned manner may be amorphous, polycrystalline or single crystal in form. This form may be influenced as desired by adjusting, for example, the cooling rate of the batch after high temperature processing. The RPD approach also enables beneficial dopants, such as Na in the case of CIS solar cells, to be introduced more uniformly in deposited thin-films by incorporating appropriate precursors in the batch.

In regard to synthesis in a sealed chamber, certain aspects of the Czochralski single crystal growth method (see, for example, U.S. Pat. No. 4,652,332 by Ciszek) are similar to RPD material synthesis. In the case of the Czochralski method however the goal is limited to pulling a single crystal from a liquid melt. In the RPD method, the goal encompasses a wider range of solidification practices and material structures.

A typical high temperature synthesis can result in a solid semiconductor body. If this is the case the body should be rendered into particles for subsequent RPD processing. The particle sizes and size distributions may be tailored for optimal film properties. Particle sizes should be sub-micrometer in dimension and more typically smaller than 100 nanometers in dimension. The semiconductor particles may be deposited on a substrate to produce a semiconductor thin film using a number of different NV deposition techniques. This approach is better suited for large area, low-cost, thin film deposition than conventional vacuum deposition techniques. Therefore, the RPD method has the advantages of both the low-cost manufacturing and the high quality semiconductor film typically achieved only with more expensive vacuum deposition techniques. Methods of rendering solid bodies into particles are well known, including: mechanical grinding, thermal shocking and jet-milling. Optionally, the resulting particles may be separated into ranges of particle sizes by sieving, centrifugation, or analogous means. In some cases, the semiconductor particles may be directly deposited onto a substrate. In other cases, however, the semiconductor particles are dispersed in a carrier fluid and then coated onto the substrate.

The carrier fluid or other vehicle in which the semiconductor particles are dispersed should be able to maintain nanoparticle dispersion for an extended period of time, in some case for as long as several days or weeks without substantial agglomeration or sedimentation. If the dispersion can be maintained for such an extended period of time, the dispersion advantageously may be prepared at one location, then transported and used on as-needed basis at another location. In addition, the vehicle should possess appropriate physical and chemical characteristics suitable for thin film deposition, such as good wetting behavior, low to intermediate viscosity, low boiling temperature, high solubility and others. For instance, in some cases it may be preferable to use the following solvents as a vehicle: alcohols, polyols, acids, hydrocarbons, water or combinations thereof. Nanoparticle concentration in the vehicle may be varied in order to adjust the overall viscosity of the solution. For example, it may be preferred to have at least 5% weight concentration and less than 50% weight concentration of semiconductor target particles.

Semiconductor particles in the vehicle may be further coated with anti-agglomeration substances prior to dispersion. Such substances may be organic or inorganic, e.g. such as commercially available polymers such as POLECRON and ACRYLIDONE. Although variously shaped particles are suitable for RPD, particles with rounded shapes, e.g. spherical shapes, are more preferable, because they improve dispersion and solution flow hydrodynamic characteristics and also may require less post-deposition processing. Furthermore, various optional additive substances may be used in the vehicle to modify and improve certain aspects of the deposition process. For example, adhesion promoters, organic or inorganic (e.g. polyvinylpyrrolidone or bismuth nitrate), may be added to improve the adhesion of a deposited film to a substrate. Rheology modifiers, such as SOL-SPERSE, may be added to improve film formation after deposition. Crystallization inhibitors or promoters may be added to vary the degree of film crystallinity and to control the crystal grain size. Other additives may include wetting angle modifiers, humectants, surfactants etc.

Semiconductor particle solutions in some respects are similar to metal nanoparticle solutions, and in others are very different from those solutions. Similarities mainly have to do with the physical properties of the solvent and corresponding solution, whereas differences are due to very different properties that are desired from the resulting films. Semiconductor particle solutions are to produce good quality polycrystalline semiconductor films. To achieve this other optional additives may be utilized, such as surface passivation agents (e.g. sodium containing surfactants), which may neutralize deep electronic traps on the surface of nanoparticles and crystal grains, thereby increasing carrier lifetime and concentration.

A number of coating and deposition methods are suitable for RPD, including roll coating, spin coating, screen printing, ink-jet printing, blade, spray deposition and others. Each of these methods has its own advantages; for instance, ink-jet printing enables one to print arbitrary shaped areas on a substrate with virtually no loss of the deposited ink. Semiconductor particle solutions may have to be adjusted and optimized for each particular method. For example, in the case of ink-jet printing, it may be preferred to have a low viscosity solution of semiconductor particles with sizes less than 100 nm. Other deposition methods may be used with solutions of larger size semiconductor particles. Alternatively, for uniform coating of large area substrates it may be preferable to use such methods as roll coating, blade and spray depositions.

After the initial deposition, the film-on-substrate will typically be further processed thermally and or chemically to achieve a desired density, structure and composition of the semiconductor film. By using pre-reacted semiconductor materials as feedstock, it is expected that the required degree and/or duration of post-processing will be reduced, thereby simplifying post processing, reducing the number of defects, reducing cost, and/or extending the range of other materials, including lower temperature substrates, which can be employed in the fabrication of PV solar cells.

The compound semiconductor thin-films deposited by the RPD method using materials fabricated in the manner described above are characterized in that they are uniform in composition and have substantially developed molecular structure and bonding in their as-deposited form, as required in the final product. In such films, the optimization of grain sizes and other desirable features requires less additional processing in terms of time-at-temperature than films formed by conventional techniques. When conventional techniques are employed, thermal processing is also required to produce the mixing and chemical reaction of the components, whereas in RPD thin-films these issues are addressed in advance.

The RPD method can impart many advantages for compound semiconductor thin-film processing over current methods. These include:

1. Processing the batch materials at higher temperatures than in conventional approaches. This facilitates better mixing and more complete reaction of the constituents.
2. Improved compositional control of the principal constituents. This can facilitate bandgap engineering without processing changes, e.g., the relationship between composition and the bandgap of the compound semiconductor $CuIn(1-x)Ga x(SySe(1-y))2$ is given by:

$$Eg=0.95+0.8x-0.17x(1-x)+0.7y-0.05y(1-y) \quad (1)$$

3. Improved doping of the thin-films through pre-doping of materials with, e.g., Na.
4. More uniform films with fewer vacancies or other performance limiting defects.
5. Films with reproducible compositions over larger areas. For higher yield and throughput consistent with low-cost manufacturing.
6. Process simplifications including (i) elimination of multi-source deposition, monitoring and control and (ii) reduction or elimination of chemical (e.g. Selenization) and/or thermal post-processing steps.
7. If desired, multiple RPD processing can also be used in sequence to engineer compositional grading. It may also be used in combination with other deposition techniques.

By the RPD method, CIS or similar films can be produced which are more uniform in composition over area and in profile than can achieved by current practices. This uniformity is expected to impart a higher performance, reproducibility and manufacturability for CIS solar cells.

Figure 2:
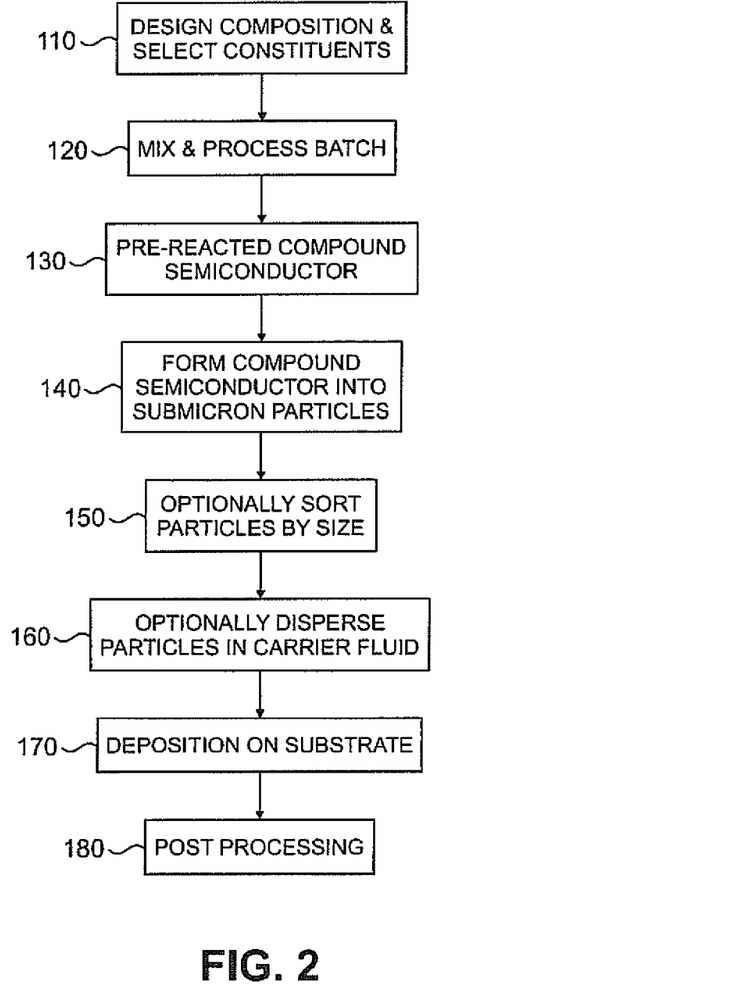
FIG. 2 is a flowchart showing one example of a process that may be employed to fabricate a thin-film semiconductor device such as a PV device.

FIG. 2 is a flowchart showing one example of a process that may be employed to fabricate a thin-film semiconductor device such as a photovoltaic device. The method begins in step 110 when the absorber layer of the semiconductor device is designed by selecting the constituent elements or compounds. Next, in step 120 these constituent materials are mixed together and, in step 130, undergo a pre-reacting process to form a homogeneous compound semiconductor material (i.e., the RPD starting material). This material is then mechanically ground or otherwise reconfigured in step 140 to convert the compound semiconductor material into particles. Optionally in step 150 the particle sizes can be pre-sorted by sieving or analogous separation techniques. Also optionally, in step 160 the particles may be dispersed in a carrier fluid appropriate for the deposition technique that will be employed. The pre-reacted compound semiconductor material in particulate or dispersed form is then deposited on a suitable substrate by the selected deposition technique in step 170. The resulting thin-film has a composition that is substantially the same as the composition of the compound semiconductor material. Finally, in step 180 any post-processing that is necessary is performed on the thin-film.

EXAMPLES

1. In one embodiment, the raw material for RPD processing is formed from a compound semiconductor material having a specified composition, examples of which are presented below. The raw material may be used in a RPD process to form a thin-film semiconductor device such as a photovoltaic device. The raw semiconductor material is pre-reacted to achieve the molecular structure and bonding of the compound. The material may be amorphous, crystalline or polycrystalline in morphology.
2. In an embodiment the pre-reacted raw material described in Example 1 is processed at temperatures above the liquidus temperature of the compound semiconductor.
3. In an embodiment, a pre-reacted raw material as described in Example 1 comprises II-VI compound semiconductor materials.
4. In an embodiment, a pre-reacted raw material is comprised of a II-VI compound semiconductor, with a composition formulated to give a specific bandgap in the resultant thin-films. Specifically, the raw material is comprised of the elements Cd, Te, Se, and/or S.
5. In an embodiment, a set of pre-reacted raw material as described in Example 4 with compositions designed to give complimentary band gaps for a multi-junction device.
6. In an embodiment, a pre-reacted raw material as described in Example 3 is doped with Cu to improve film performance.
7. In another embodiment a pre-reacted raw material as described in Example 3 comprises Cd—S.
8. In another embodiment a pre-reacted raw material as described in Example 3 comprises Cd—Se.
9. In another embodiment a pre-reacted raw material as described in Example 3 comprises Cd—Te.
10. In another embodiment a pre-reacted raw material as described in Example 3 comprises Cd—Zn—Te.
11. In another embodiment a pre-reacted raw material as described in Example 3 comprises Cd—Hg—Te.
12. In another embodiment a pre-reacted raw material as described in Examples 4-10 which includes Cu as a minor constituent.
13. In another embodiment a pre-reacted raw material as described in Example 1 comprises a I-III-VI compound semiconductor materials.
14. In another embodiment, a pre-reacted raw material is provided which is comprised of a I-III-VI compound semiconductor, with a composition formulated to give a specific bandgap in the resultant thin-films. Specifically, the pre-reacted raw material may be comprised of the elements Cu, In.Ga.Al, S, Se and/or Te.
15. In another embodiment, a set of pre-reacted raw material as described in Example 14 with compositions designed to give complimentary band gaps for a multi-junction device.
16. In another embodiment a pre-reacted raw material as described in Example 13 comprises Cu—In—Se. The pre-reacted raw material preferably has a polycrystalline form of $CuInSe_2$.
17. In another embodiment a pre-reacted raw material as described in Example 13 comprises Cu—In—Ga—Se. The pre-reacted raw material preferably has a polycrystalline form of $CuIn(1-x)Ga_xSe_2$, where x may be in the range from 0 to 1, preferably between 0.2 and 0.7, more preferably between 0.3 and 0.5. Furthermore, the pre-reacted raw material may have a preferred composition of $CuIn0.7Ga0.3Se_2$, which may be most suitable for absorber film deposition for use in photovoltaic devices.
18. In another embodiment a pre-reacted raw material as described in Example 13 comprises Cu—In—Ga—Se—S. The pre-reacted raw material preferably has a polycrystalline form of $CuIn(1-x)Ga_x(Se(1-y)S_y)_2$, where x and y may be in the range from 0 to 1. Furthermore, x and y may be preferably between 0.2 and 0.7 and between 0 and 0.6. Furthermore, the pre-reacted raw material may have a preferred composition of $CuIn0.4Ga0.6(Se0.4S0.6)_2$, which may be most suitable for wide-bandgap absorber film deposition for use in photovoltaic devices.
19. In another embodiment a pre-reacted raw material as described in Examples 17 and 18 which includes Al in complete or partial substitution for Ga. The target may have a preferred composition of $CuIn0.5Al0.5Se_2$, which may be suitable for wide-bandgap absorber film deposition for use in photovoltaic devices.
20. In another embodiment a pre-reacted raw material as described in Examples 14-19 which includes Na as a minor constituent. The target preferably contains less than 1 at. % of sodium, more preferably less than 0.1 at. % of sodium.
21. In another embodiment a pre-reacted raw material as described in Examples 14-19 which includes alkali elements other than Na as minor constituents.
22. In another embodiment a pre-reacted raw material as described in Examples 14-19 which includes F as a minor constituent.
23. In another embodiment a pre-reacted raw material as described in Examples 14-19 which include a halogen element other than F as minor constituents.
24. In another embodiment a RPD method is used to form a homogeneous thin-film of a compound semiconductor which closely replicates the composition of the pre-reacted raw material.
25. In another embodiment a RPD method is used to form a homogeneous thin-film from a compound semiconductor target, in combination with other material sources for simultaneous or sequential depositions.
26. In another embodiment a method as described in Example 24 is used which includes multiple RPD deposition steps.
27. In another embodiment a method as described in example 24 is used along with additional deposition steps other than RPD deposition steps.
28. In another embodiment a method as described in Examples 24-27 is used which includes ink jet printing.
29. In another embodiment a method as described in Example 24-27 is used which includes electrophoretic deposition.
30. In another embodiment a method as described in Example 24-27 is used which includes nano-particle deposition.
31. In another embodiment, the RPD method as described above may be used to deposit a thin-film of a compound semiconductor onto a substrate, which may be flat, textured or curved. The compound semiconductor material may be $CuInSe_2$ and the resulting film may have a thickness in the range of 1-10 microns, preferably about 1-2 microns. The substrate material may be glass, preferably soda lime glass or Corning 1737 glass having a coefficient of thermal expansion (CTE) close to that of CIS-type materials. The substrate may further include additional thin-film layers, for example such as dielectric barrier layers made from SiO2 or Si3N4, or conducting layers made from Mo or W films.

32. In another embodiment, the thin-film described in Example 31 may be modified to include a thin-film of CuIn0.7Ga0.3Se2.

33. In another embodiment, the thin-film described in Example 31 may be modified to include a thin-film of CuOn0.5Al0.5Se2.

34. In another embodiment, the thin-film described in Example 31 may be modified to include a thin-film of CuInS2.

35. In another embodiment, the thin-film described in Example 31 may be modified to include a thin-film of CuGaSe2.

36. In another embodiment, the thin-film described in Example 31 may be modified to include a thin-film of CdTe.

37. In another embodiment, the thin-film described in Example 31 may be modified to include a thin-film of a compound semiconductor having a thickness of less than 1 micron, and preferably less than 0.5 micron, which leads to cost reductions in the manufacturing of electro-optic devices containing such a film.

38. In another embodiment, the thin-film described in Example 31 may be modified by annealing at temperature of at least 450° C., preferably at 500° C. or above, which would promote crystal grain growth and improve electro-optic properties of this film, such as electron and hole mobilities, carrier lifetime, and optical quantum efficiency.

39. In another embodiment, the thin-film described in Example 31 may be deposited on a stainless steel substrate. The stainless steel may further contain at least 13% of Cr, preferably 16-18% of Cr. The stainless steel substrate may also be polished to have surface roughness of less than 10 nm, and preferably of less than 2 nm.

40. In another embodiment, the thin-film described in Example 31 may be deposited on a polyimide substrate. Furthermore, the film may be annealed at temperatures of at least 400° C.

41. In another embodiment, the thin-film described in Example 31 may be deposited on a low temperature polymer substrate, such as polyamide or polyethylene terephthalate (PET). Furthermore, the film may be annealed at temperatures of 300° C. or less. The RPD process may enable grain growth at lower temperatures as compared to those of regular film deposition approaches.

42. In yet another embodiment, the RPD method described in Example 31 may be used to produce an electro-optic device that includes at least one semiconductor junction having a thin-film of a compound semiconductor deposited using the RPD method. The junction may be formed at the interface between the RPD thin-film and another semiconductor film. The conduction types may be opposite on opposite sides of the junction so that the junction may be a PN type junction. In addition, the device may include at least two conducting layers and a substrate for supporting all of the described layers. At least one the conducting layers may be transparent.

43. In another embodiment, the device described in Example 42 is a photovoltaic (PV) device.

44. In another embodiment, the device described in Example 42 includes a heterojunction.

45. In another embodiment, the device described in Example 42 includes a MIS (metal-insulator-semiconductor) type junction.

46. In another embodiment, the device described in Example 42 includes a thin-film of a I-III-VI compound semiconductor, such as a CIGS-type material.

47. In another embodiment, the device described in Example 42 includes a thin-film of a II-VI compound semiconductor, such as CdTe.

48. In another embodiment, the device described in Example 42 includes a stack that includes a glass substrate, Mo metal layer, CIS layer, CdS layer, i-ZnO layer and n-ZnO layer. It may also be preferred to omit the CdS layer and avoid Cd contamination without detrimental effects to the device performance.

49. In another embodiment, the device described in Example 42 includes a thin-film formed from a wide-bandgap compound semiconductor having a bandgap greater than 1.4 eV, preferably greater than 1.55 eV, and more preferably greater than 1.7 eV.

50. In another embodiment, the device described in Example 42 includes a homogeneous thin-film formed from a wide-bandgap compound semiconductor having an open circuit voltage greater than 0.8 V, preferably more than 0.9 V.

51. In another embodiment, the device described in Example 42 includes a homogeneous thin-film formed from a compound semiconductor having a large area of greater than 100 cm2 and power conversion efficiency greater than 15%.

52. In another embodiment, the device described in Example 42 includes a homogeneous thin-film formed from a CIGS-type semiconductor having a large area greater than 100 cm2 and a power conversion efficiency greater than 15%.

53. In yet another embodiment, the RPD method described in Example 42 may be used to produce an electro-optic device that includes a plurality of modules. Each module has at least one semiconductor junction formed by a thin-film of a compound semiconductor deposited using the RPD method and another adjacent semiconductor layer. Such a device may be a multi-junction PV device, which is known to be potentially a more efficient PV device than single-junction PV devices. A multi-junction PV device requires different semiconductor layers, each having a different bandgap. For example, in the case of a triple junction PV device, it may be preferred to have semiconductors with bandgaps of about 1.0 eV, 1.4 and 1.8 eV. Standard CIGS film deposition methods fail to produce homogeneous films with a uniform bandgap across the film; the resulting films are often characterized by poorly defined and controlled graded-bandgap profiles. Thus, it has been difficult to define a bandgap in a multifunction PV device using standard approaches. On the other hand, the RPD method is more suitable to production of multi-junction devices, since well-defined bandgap materials can be easily produced and precisely deposited across large areas.

54. In another embodiment, the device described in Example 42 includes homogeneous thin-films of three different CIGS type semiconductors: CuInSe2, CuIn0.6Ga0.4Se2 and CuIn0.6Ga0.4(S0.6Se0.4)2.

55. In another embodiment, the RPD semiconductor thin-film semiconductor materials described in Example 42 may be incorporated in a photovoltaic device of the types disclosed in co pending U.S. application Ser. No. 12/034,944 entitled "Method and Apparatus For Manufacturing Multi-Layered Electro-Optic Devices," which is hereby incorporated by reference in its entirety.

56. In another embodiment, the RPD semiconductor thin-film semiconductor materials described in Example 42 may be formed on a substrate in which an electrically conducting grid is embedded, which is disclosed in co pending U.S. application Ser. No. 12/038,893 entitled "Method and Apparatus For Fabricating Composite Substrates For Thin Film Electro-Optical Devices," which is hereby incorporated by reference in its entirety.

The invention claimed is:

1. A method of fabricating a thin-film semiconductor device, comprising:
providing a homogeneous compound semiconductor material having a uniform composition and a uniform molecular structure and bonding;
forming fine-compound semiconductor particles less than 1 micrometer in dimension from the homogeneous compound semiconductor material;
depositing the fine compound semiconductor particles, or a dispersion thereof, onto a substrate to form a deposited thin-film; and
thermally processing the deposited thin-film to form a thermally processed thin-film having a composition substantially the same as a composition of the homogeneous compound semiconductor material.

2. The method of claim 1 wherein the homogeneous compound semiconductor material include II-VI compound semiconductor materials.

3. The method of claim 2 wherein the II-VI compound semiconductor materials are selected from the group consisting of Cd—S, Cd—Se, Cd—Te, Cd—Zn—Te, Cd—Hg—Te, Cu—In—Se.

4. The method of claim 3 further comprising providing Cu as a minor constituent along with the II-VI compound semiconductor materials.

5. The method of claim 1 wherein the homogeneous compound semiconductor material include compound semiconductor materials.

6. The method of claim 5 wherein the compound semiconductor materials are selected from the group consisting of Cu—In—Se, Cu—In—Ga—Se, Cu—In—Ga—Se—S.

7. The method of claim 6 further comprising providing Al in complete or partial substitution for Ga.

8. The method of claim 5 further comprising providing Na as a minor constituent along with the compound semiconductor materials.

9. The method of claim 5 further comprising providing an alkali element other than Na as a minor constituent long with the compound semiconductor materials.

10. The method of claim 5 further comprising providing F as a minor constituent along with the compound semiconductor materials.

11. The method of claim 5 further comprising providing a halogen element other than F as a minor constituent along with the compound semiconductor materials.

12. The method of claim 1 wherein the dispersion of the fine-compound semiconductor particles is formed in a carrier material selected from the group consisting of alcohols, polyols, acids, hydrocarbons, and water.

13. The method of claim 1 wherein a concentration of the fine-compound semiconductor particles in the dispersion is between about 5% weight concentration and 50% weight concentration.

14. The method of claim 1 further comprising pre-reacting a plurality of raw semiconductor materials to form the homogeneous compound semiconductor material having the uniform composition and the uniform molecular structure and bonding.

15. The method of claim 14 wherein said pre-reacting the plurality of raw semiconductor materials includes processing the plurality of raw semiconductor materials in a sealed pressurized vessel in an atmosphere of inert gas.

16. The method of claim 15 wherein said processing the plurality of raw semiconductor materials further comprising heating the sealed pressurized vessel.

17. The method of claim 16 wherein said heating the sealed pressurized vessel includes heating the sealed pressurized vessel to a temperature above the liquidus temperature of the plurality of raw semiconductor materials.

* * * * *